(12) United States Patent
Sekiya et al.

(10) Patent No.: US 8,597,797 B2
(45) Date of Patent: Dec. 3, 2013

(54) CHROMIUM NITRIDE ION-PLATING COATING AND ITS PRODUCTION METHOD, AS WELL AS PISTON RING USED FOR INTERNAL COMBUSTION ENGINE

(75) Inventors: Takuma Sekiya, Kashiwazaki (JP); Terushige Ueda, Kashiwazaki (JP); Yuji Shima, Kashiwazaki (JP); Shigeo Inoue, Kashiwazaki (JP)

(73) Assignee: Kabushiki Kaisha Riken, Tokyo (JP)

( * ) Notice: Subject to any disclaimer, the term of this patent is extended or adjusted under 35 U.S.C. 154(b) by 854 days.

(21) Appl. No.: 12/514,679

(22) PCT Filed: Nov. 12, 2007

(86) PCT No.: PCT/JP2007/071918
§ 371 (c)(1),
(2), (4) Date: Feb. 26, 2010

(87) PCT Pub. No.: WO2008/059791
PCT Pub. Date: May 22, 2008

(65) Prior Publication Data
US 2010/0295251 A1    Nov. 25, 2010

(30) Foreign Application Priority Data

Nov. 14, 2006 (JP) ................................. 2006-308077

(51) Int. Cl.
*B32B 15/04* (2006.01)
*F16J 9/26* (2006.01)
*C23C 14/06* (2006.01)

(52) U.S. Cl.
USPC ........... 428/627; 277/434; 277/440; 277/442; 427/523; 427/530; 427/531; 428/615; 428/621; 428/689; 428/698; 428/699

(58) Field of Classification Search
CPC ........... C23C 30/00; C23C 30/005; F16J 9/26
USPC ................. 428/615, 621, 689, 698, 699, 627; 277/440, 442, 443, 434, 444; 427/523, 427/530, 531; 29/888.074, 888.048, 29/898.12; 106/286.1; 205/156; 204/192.11, 192.16; 148/212, 230, 238
See application file for complete search history.

(56) References Cited

U.S. PATENT DOCUMENTS 4,643,952 A * 2/1987 Kurakata ....................... 428/472
(Continued)

FOREIGN PATENT DOCUMENTS

EP        0884400 A1    12/1998
EP        1087031 A2    3/2001
(Continued)

OTHER PUBLICATIONS

C. Gautier et al. "Comparative study of mechanical and structural properties of CrN films deposited by d.c. magnetron sputtering and vacuum arc evaporation." 1996. Elsevier. Surface and Coatings Technology. vol. 86-87. pp. 254-262.*

(Continued)

*Primary Examiner* — David Sample
*Assistant Examiner* — Nicholas W Jordan
(74) *Attorney, Agent, or Firm* — Birch, Stewart, Kolasch & Birch, LLP

(57) ABSTRACT

[Task] The chromium nitride ion-plating coating has a property that it is hard but is liable to peel off. Year by year, the required level of wear resistance and scuffing resistance becomes higher in a diesel engine. The property of a coating is improved to enhance the wear resistance and scuffing resistance and also to improve resistance against peeling off.
[Means for Solution] (1) Composition is mainly composed of chromium, nitrogen, and carbon, and the concentration of carbon relative to the total concentration of the main components is from 4 to 8% by weight. (2) The crystal structure is that texture of the CrN (111) plane orientation is from 0.4 to 2.0 in terms of a CrN (111) structural coefficient. (3) Vickers hardness is from Hv 1600 to Hv 2000.

3 Claims, 4 Drawing Sheets

(56) References Cited

U.S. PATENT DOCUMENTS

| | | | |
|---|---|---|---|
| 4,943,486 A * | 7/1990 | Uchiyama | 428/469 |
| 5,449,547 A | 9/1995 | Miyazaki et al. | |
| 5,851,659 A * | 12/1998 | Komuro et al. | 428/698 |
| 6,060,182 A * | 5/2000 | Tanaka et al. | 428/698 |
| 6,372,369 B1 * | 4/2002 | Ito et al. | 428/698 |
| 6,494,461 B1 | 12/2002 | Ogawa et al. | |
| 6,631,907 B1 * | 10/2003 | Onoda et al. | 277/443 |
| 7,891,669 B2 * | 2/2011 | Araujo et al. | 277/442 |
| 2006/0269790 A1 * | 11/2006 | Sarabanda et al. | 428/698 |
| 2009/0142509 A1 * | 6/2009 | Yamamoto | 427/527 |
| 2012/0126488 A1 * | 5/2012 | Avelar Araujo | 277/443 |

FOREIGN PATENT DOCUMENTS

| | | |
|---|---|---|
| GB | 2276176 A | 9/1994 |
| JP | 4-64 A | 1/1992 |
| JP | 6-300130 A | 10/1994 |
| JP | 2000-136875 A | 5/2000 |
| JP | 2005-187877 A | 7/2005 |

OTHER PUBLICATIONS

Extended European Search Report in European Application No. 07831648.6 mailed Jul. 13, 2010.

Wang et al., "The Morphology and Orientation of Cr—N Films Deposited by Reactive Ion Plating," Metallurgical and Protective Layers, Thin Solid Films, vol. 185, No. 2, Mar. 1, 1990, XP024547305, pp. 219-230.

Written Opinion dated Feb. 12, 2008.

* cited by examiner

CHROMIUM NITRIDE ION-PLATING COATING AND ITS PRODUCTION METHOD, AS WELL AS PISTON RING USED FOR INTERNAL COMBUSTION ENGINE

TECHNICAL FIELD

The present invention relates to hard chromium nitride ion-plating coating having improved tribological properties, and its production method. The present invention also relates to a piston ring, on which the coating mentioned above is formed, and which is used for an internal combustion engine.

BACKGROUND TECHNIQUE

Functions of a piston ring includes: a gas seal function to assure that the combustion chamber of an internal combustion engine is gas tight; an oil controlling function that controls thickness of a lubricating oil film formed on the surface of cylinder liner; and a heat conducting function that transmits heat from a piston, which is heated by fuel combustion, to a cylinder liner in order to cool the piston. To realize such functions, a piston ring must be always subject to tension stress that will cause it to bulge and tightly contact with a cylinder liner. As a result, a piston ring will then seal high-pressure combustion gas generated in the combustion process of an engine. The sliding surface of a top ring is, therefore, inevitably subjected to high pressure and exposed to conditions under which wear and scuffing are liable to occur.

In recent years, the operating conditions of a piston ring have tended to become increasingly severe because of the following factors. To meet with tightened exhaust gas regulations, combustion temperature and surface pressure load are enhanced. Low-viscosity lubricating oil is employed. Meanwhile, high pressure fuel injection is often employed, for example, in a common-rail diesel engine. Thus, improvement in wear resistance and scuffing resistance of a piston ring will have to be required. Also, as is known from Non Patent Document 1: Machine Mechanism Thesis No. 03-1vol. III (2003), *Research of Hardness of Soot in Diesel Engine Oil*, page 137 by Hidetsugu Yamamoto and two others, combustion products, which form during the combustion process and have a Vickers hardness of Hv1500 or more, reach the sliding surface between the piston ring and the cylinder liner, and cause abrasive wear.

Conventionally, hard Cr gas plating is applied on the outer peripheral surface of a piston ring. Also, the martensitic stainless steel of the outer peripheral surface of a piston ring is nitrided. This conventional method is replaced by forming a hard coating, such as ion-plating nitride or carbide.

Patent Document 1. Japanese Published Patent Application No. Sho57-57868 discloses that, by use of the PVD method, a hard coating such as TiC, TiN, chromium nitride, or the like is applied on the sliding surface of a piston ring. Allegedly, TiC or TiN reactive ion-plating coating and chromium nitride reactive sputtering coating improve wear resistance and heat resistance of a piston ring. However, TiC or TiN coating formed through reactive ion-plating and chromium nitride coating formed through reactive sputtering are poor in adhesion. Their thick coating is liable to peel. Their use has therefore been limited to certain special applications, and has not found broad utility in practice.

Patent Document 2: Japanese Published Patent Application No. sho 61-87950 is directed to an improvement of Patent Document 1, Japanese Published Patent Application No. sho57-57868. Patent Document 2 discloses that the reactive ion-plating method is applied on the sliding surface of a piston ring to form a coating having an ultra-fine mixed structure of metallic Cr and Cr nitride. Since the reactive ion-plating forms an ultra-fine mixed structure of metallic Cr and Cr nitride in the coating on a sliding surface, the adherence of coating is improved, according to the disclosure, and a thick coating can be used. Durability of the piston rings is improved to such a level that the piston rings with a Cr nitride reactive ion-plating coating have since been broadly used. However, the piston rings are used increasingly in severe conditions in diesel engines, where waste gas must be purified and fuel economy must be improved. Such conditions lead to cracking and peeling of the nitride Cr coating of a top ring of diesel engine, and countermeasures are required.

Patent Document 3: Japanese Published Patent Application No. Hei4-64 discloses that wear resistance and scuffing resistance are improved by forming an HCD ion-plating coating on the outer peripheral sliding surface of a piston ring, which coating consists of Cr, carbon, and nitrogen, and which contains from 0.1 to 14% by weight of carbon and from 0.5 to 22% by weight of nitrogen. However, there is no description at all concerning the relation of the crystal structure of the ion-plating coating to crack resistance and peeling resistance.

Patent Document 4: Japanese Published Patent Application Hei 6-248425 proposes a countermeasure to deal with the problem of the ion-plating Cr nitride coating tending to crack or peel during use in a diesel engine. It is disclosed that the ion-plating Cr nitride coating formed on the outer peripheral surface of a piston ring has from 1.5 to 20% of porosity. Thus, not only wear resistance and scuffing resistance are improved, but also cracking and peeling of the coating is greatly resisted even in more severe use. It is also disclosed that peeling resistance is further improved by forming a columnar fracture morphology of the coating and orienting the CrN (111) plane texture of crystal parallel to the outer peripheral surface. The Cr nitride coating of Patent Document 4 can be thickly formed, because it has improved resistance against defective peeling off and has improved adherence. This coating has subsequently become much used for piston rings of diesel engines, which are required to have durability. However, since a number of pores are present in the coating, coating hardness is lower than the original hardness of chromium nitride. Abrasive wear of such a coating is liable to occur in recent engines, where hard particles are generated.

Patent Document 5: Japanese Published Patent Application No. Hei 6-300130 proposes to control bias voltage and concentration of methane gas during an arc ion-plating. From 2 to 11% by weight of solute carbon is contained in the crystal structure of the thus-formed chromium nitride. The coating has a Vickers hardness of Hv 1600-2200. In that disclosure, a test carried out using a Van der Horst friction tester reveals coatings produced by that method show improved scuffing resistance and toughness compared to conventional chromium nitride coatings. Nevertheless, there are no descriptions as to how much improvement the actual piston rings have attained. Experiments performed by the inventors of the present application revealed that its toughness is unsatisfactory for using it for the outer peripheral sliding surface of a piston ring in a recent type of high-load diesel engine.

Patent Document 6: Japanese Patent No. 2692758 refers to Patent Document 1 as one of prior art and aims to achieve improvement in wear resistance, scuffing resistance, and peeling of coating. The disclosed chromium nitride ion-plating coating has a (200) texture such that the X-ray diffraction peak intensity of the CrN (200) plane of CrN type chromium nitride is at least twice as high as the same intensity of the (111) plane. Using the reactive ion-plating method to form a chromium nitride coating, metallic chromium is vaporized in nitrogen atmosphere with reduced pressure. Peeling of a coating is tested by a bench test of a gasoline engine.

Patent Document 7: Japanese Patent No.2730571 discloses a chromium-nitride type ion-plating coating, containing difficult-to-peel off columnar crystals, and a flat layer that has improved scuffing resistance, is laminated on one another. Peeling of a coating is evaluated by a bench test of a diesel engine.

Non Patent Document 1: Machine Mechanism Thesis No. 03-1vol. III (2003), *Research of Hardness of Soot in Diesel Engine Oil*, page 137 by Hidetsugu Yamamoto and two others.

Patent Document 1: Japanese Published Patent Application No. sho57-57868

Patent Document 2: Japanese Published Patent Application No. sho61-87590

Patent Document 3: Japanese Publication Patent Application No. Hei4-64

Patent Document 4: Japanese Publication Patent Application No. Hei6-300130

Patent Document 5: Japanese Publication Patent Application No. Hei6-248425

Patent Document 6: Japanese Patent No. 2692758

Patent Document 7: Japanese Patent No. 2730517

DISCLOSURE OF INVENTION

Problems to be Solved by Invention

As is described hereinabove, higher and higher levels of wear resistance and scuffing resistance are required in recent years particularly in diesel engines. Since ion-plating chromium nitride coatings having improved wear and scuffing resistances and also having improved resistance against defective peeling off have not yet been achieved, their development is keenly desired.

The present inventors anticipate that the fracture toughness value, which is used to evaluate resistance to crack propagation in ceramic material, can also be used as a yardstick for evaluating resistance against defective peeling off of a chromium nitride ion-plating coating.

The present inventors first tried to verify the performance of the chromium nitride ion-plating coatings described in Patent Document No. 5, Japanese Published Patent Application No. Hei 6-248245, which allegedly have improved resistance against defective peeling-off. Chromium nitride coatings, which had approximately 0%, approximately 1.5%, approximately 2.5%, approximately 4%, and approximately 8% of porosity according to the description of the patent specification, were coated on a top ring of a high-load diesel engine. The fracture toughness value of the coatings was measured. In addition, an engine test was carried out for a diesel engine with six cylinders of 135 mm in inner diameter over 100 hours at a load of 4/4.

The results are shown in Table 1. A coating whose porosity was approximately 0% exhibited a fracture toughness value of 0.75 MPa×(m)$^{1/2}$, and produced peeling off. Other coatings whose porosities were 1.5% or more exhibited fracture toughness value of 2.63 MPa×(m)$^{1/2}$ or more, and cracks were not appreciable. However, since the coating hardness is Hv 1008-1530 and hence relatively low, wear amount is from 1.3 to 2 times as high as that of the coating having approximately 0% porosity. Based on these facts, the present inventors have come to be quite positive that a coating which has a fracture toughness value of approximately 3 MPa×(m)$^{1/2}$ or more and a coating hardness of Hv 1600 or more would be free of defective peeling off and have improved wear resistance, and thus would be useful for the outer peripheral surface of a top ring mounted on a present high load diesel engine. Accordingly, the present inventors have continued research in order to develop an ion-plating coating which is free of porosity and hence exhibits no hardness reduction and exhibits high fracture toughness value. Here, "m" is a unit of length.

TABLE 1

Results of Engine Experiment

| Porosity of Coating % | Toughness Fracture Value MPa × (m)$^{1/2}$ | Defective Peeling off | Hardness of Coating Film Hv0.3 | Wear Amount μm |
|---|---|---|---|---|
| Virtually 0 | 0.75 | Occurrence | 1635 | 4.9 |
| 1.53 | 2.63 | No occurrence | 1530 | 6.2 |
| 2.45 | 2.82 | No occurrence | 1337 | 7.6 |
| 4.09 | 3.08 | No occurrence | 1109 | 8.9 |
| 8.23 | 3.14 | No occurrence | 1008 | 9.6 |

\* Porosity was obtained from the configuration of the outer peripheral surface of the coating.
\* Wear amount was obtained from the configuration of the outer peripheral surface.

The fracture toughness values herein are obtained using the Vickers indentation method. Although the resistance of a coating against defective peeling off can be evaluated by an actual machine test of an engine, qualitative values cannot be obtained by this test. Feedback of the obtained characteristics to the coating structure cannot be expected. The Vickers indentation method is, therefore, employed. This is a method to test fracture toughness value of fine ceramics and is standardized in JIS R1607. Fracture toughness value testing methods at room temperature are specified in JIS to test fine ceramics used as high-strength materials, such as mechanical parts and structural materials. They include a fracture method in which a crack is preliminarily introduced and a probe forcing method. According to the probe forcing method, a Vickers probe is forced into the testing surface. Lengths of the thus formed indentation and crack are measured. Fracture toughness value can be then obtained from the pressing load, the width across corners of an indentation, and the crack length. However, since JIS specifies that a specimen desirably has a thickness of 3 mm or more, such a coating as that of the present invention cannot be measured. Accordingly, the fracture toughness value is obtained in the present invention by a method different from JIS. That is, a Vickers probe is forced into the cross section of a coating so as to form an indentation and a crack. A fracture toughness value of a coating is obtained from the indentation and length of a crack. The crack generates parallel to the surface of a coating due to a residual stress remaining in the coating. Since a crack extends parallel to the surface of coating, its length is defined to be a distance between a central point of the indentation and a leading end of the crack.

$$Kc=0.026\{(E^{1/2}P^{1/2}a)/C^{3/2}\}$$ [Mathematical 1]

Kc: fracture toughness value (Pa×(m)$^{1/2}$)
E: elastic ratio (Pa)
P: forcing load (N)
a: ½ of average width between diagonal corners of indentification (m)
C: ½ of average crack length (m)

As described hereinabove, chromium nitride ion-plating coating is a coating having improved wear resistance and scuffing resistance, and has conventionally been used on the sliding surface of a sliding member. However, it has a drawback that "it is hard but is liable to peel off." Solution of this problem has heretofore been pursued. A conventional solution is reviewed as follows. An outer peripheral surface of a piston ring is a sliding surface, on which a coating surface having enhanced wear resistance should be formed. Such coating is formed to induce a compressive residual stress in the surface. As a result, tensional stress in thickness direction remains in the coating. The coating is, therefore, subjected to repeated stress in the thickness direction. Fatigue leads to generation of cracks in the coating. Such cracks are liable to propagate in a parallel direction to the coating and lead to defective peeling off. Therefore, Patent Document 4, Japanese Published Patent Application No. Hei6-248425, proposes that columnar crystals align toward the surface of a coating on the fracture surface of a chromium nitride coating. In addition, the coating has pores of from 1.5 to 20% of porosity. Such proposal appears to attain reduction of the remaining compression stress of the coating surface. In other words, the remaining tensile stress of a coating in the thickness direction is reduced so that propagation of a crack in a parallel direction of coating is suppressed; and, defective peeling off of coating can be prevented. However, hardness of a coating decreases due to pores therein. In addition, wear resistance is impaired because the remaining compressional stress on the coating surface is reduced.

Means for Solving the Problems

The present inventors conceived an idea as follows. Crack propagation in a direction parallel to the coating can be suppressed without decreasing a coating hardness, when the chromium ion-plating coating is so dense and free of pores and columnar crystals orient toward the surface of a coating on a fracture surface of the coating. The present inventors have thus attained the present invention. It was discovered that when the composition, crystal structure, and texture of a chromium nitride ion-plating coating are specified, Vickers hardness of the coating is Hv 1600 or more, and hence its wear resistance is improved, and, fracture toughness value is 3 MPa×(m)$^{1/2}$ or more. The thus-proposed chromium nitride ion-plating coating exhibits no defective peeling off even it is used in severe sliding circumstances.

In addition, a piston ring having such chromium nitride ion-plating coating on the outer peripheral surface and method for producing the piston ring are proposed.

The present inventors have made energetic efforts to accomplish the task mentioned above and have achieved the present inventions: A chromium nitride ion-plating coating is characterized in that the fracture surface of the coating has columnar crystals extending toward the surface of a coating; it is mainly composed of chromium, nitrogen, and carbon, the concentration of which relative to the total concentration of the main components is from 4 to 8% by weight; and the texture of CrN (111) plane orientation is from 0.4 to 2.0 in terms of a CrN (111) structural coefficient. A piston ring having this coating at least on the outer peripheral surface has improved wear resistance and scuffing resistance and also improved resistance against defective peeling off.

Namely, a chromium nitride ion-plating coating according to the present invention is mainly composed of chromium, nitrogen, and carbon and is characterized in that the fracture surface of the coating has columnar crystals extending toward the surface of the coating; a concentration of carbon relative to the total concentration of the main components is from 4 to 8% by weight; and the texture of CrN (111) plane orientation is from 0.4 to 2.0 in terms of the CrN (111) structural coefficient. Vickers hardness of the coating is Hv 1600 or more, and fracture toughness value is 3 MPa×(m)$^{1/2}$ or more. Such a chromium nitride ion-plating coating has improved wear resistance, and generation of defective peeling off hardly occurs. Hereinafter the present invention is described by referring, one by one, to the composition, crystal structure, crystal texture, fracture surface of coating, piston ring, production method, and properties.

Composition

The chromium nitride ion-plating coating according to the present invention is mainly composed of chromium, nitrogen, and carbon. Chromium nitride can be identified by a qualitative analysis by X-ray diffraction of the coating. The chromium nitride ion-plating coating according to the present invention is a film which may be formed only of chromium, nitrogen, and carbon, and may contain in addition to these indispensable components, any optional elements contained in chromium nitride. As long as chromium nitride is identified, the following presence and the like are possible. Vaporizing materials may be incorporated in a coating as so-called droplets, and impurities and the like contained in high purity Cr of chromium material may be incorporated into a coating as the solid foreign matter. However, the solid foreign matter, to which the chromium carbide and the droplets belong, reduces the fracture toughness value and wear resistance. Therefore, the smaller is the amount of such solid foreign matter, the better. Pores, which can be considered as a gaseous foreign matter, may be present in a range that the coating hardness is fulfilled. On the other hand, unreacted hydrocarbon, nitrogen, and the like may be contained as gaseous impurities.

Crystal Structure

In the present invention, the chromium nitride ion-plating coating has preferably a main crystal structure of CrN-type chromium nitride. The main crystal structure of CrN-type chromium nitride indicates that the intensity of X-ray diffraction from any plane of the CrN-type chromium nitride is higher than the intensity from the equivalent plane of a Cr$_2$N-type chromium nitride.

Crystal Texture

In addition, X-ray diffraction of the chromium nitride ion-plating coating reveals a CrN (111) plane. This CrN (111) plane should orient parallel to the coating surface at a high degree. Specifically, the texture degree of CrN (111) plane orientation should be such that the structural coefficient described hereinafter is from 0.4 to 2.0.

Fracture Surface of Coating

Desirably, columnar crystals having a diameter of 0.2 to 5 μM are oriented toward the coating surface of a chromium nitride ion-plating coating. When the diameter is 0.2 μm or less, the columnar crystals are not effective for suppressing crack propagation. On the other hand, when the diameter is 5 μm or more, pores are so large that coating hardness and hence wear resistance lower. The size of columnar crystals can be measured from the secondary electron image of the film's fracture surface under an electron microscope (cf. FIG. 4). A coating should be fractured in such a manner that the crystal morphology is not affected by fracture. That is, an indentation, a groove, a notch or the like is formed on a substrate and then fracture is carried out.

Piston Ring

The second invention of the present application is drawn to a piston ring of an international combustion engine and is characterized by having a chromium nitride ion-plating coating as discussed above on at least an outer peripheral surface thereof. The piston ring of an internal combustion engine is not limited to a piston ring of a high-load diesel engine but includes a piston ring used for general diesel engines and gasoline engines.

Production Method

The third invention of the present application is a method for forming a chromium nitride ion-plating coating as discussed above by an arc-ion-plating and is characterized in that a metallic chromium coating is formed by arc-ion-plating method, and a chromium nitride ion-plating coating is formed by an arc ion-plating method in low-pressure gas atmosphere consisting of nitrogen gas, hydrocarbon gas, and argon gas, at −30V to 0V of bias voltage. Incidentally, 0V bias-voltage indicates that bias voltage is not intentionally applied.

Properties

A chromium nitride ion-plating coating according to the present invention is mainly composed of chromium, nitrogen, and carbon. A carbon concentration relative to the total concentration of the main components is 4 to 8% by weight. The fracture surface of the coating has a columnar morphology extending toward the surface of a coating. The texture of the CrN (111) plane, which orients parallel to the coating surface, is 0.4 to 2.0 in terms of the CrN (111) structural coefficient. Since the chromium nitride ion-plating coating has a coating hardness of Hv 1600 or more and is highly wear resistant, such coating exhibits a fracture toughness value of 3 MPa×$(m)^{1/2}$ and has improved resistance against defective peeling off. Such a piston ring is resistive to defective peeling off and does not cause abnormal wear, even when it is used for a piston ring of a high load diesel engine, that is, a piston ring operated under severe wear circumstances, where resistance against wear and defective peeling off are required. It is needless to say that the present coating is effective also for a piston ring of gasoline engine.

The reasons for limitation in the present invention are described below.

Reasons for Limitation (1) Inclusion of Carbon

According to the prior art of Patent Document Nos. 4 through 7, crystals contained in a coating grow columnar in the ion-plating coating, while being influenced by the unevenness and the like of a substrate. Direction of the columnar crystals is not necessarily one direction. A crystal is brought into contact with or collision on a neighboring columnar crystal during growth. Presumably, vaporizing particles moving toward the substrate cannot deposit behind the contact points of the neighboring columnar crystals near a substrate, with a result that a vacant space or a pore is formed. Growth of a columnar structure in a direction vertical to the peripheral surface should be maintained in an ion-plating coating, while pores should be lessened to enhance the coating hardness. This can be attained by smoothening, as much as possible, the surface roughness of an underlying layer, or by thinning and shortening the columnar chromium nitride structure. However, smoothening of the substrate's underlying layer cannot be applied to every type of substrate, because surface shape of sliding members differs greatly. Therefore, modification of chromium nitride columnar structure was considered. An idea conceived was manipulation of chromium nitride crystals so as to grow from an increased number of sites, thereby thinning and shortening the columnar structure of chromium nitride. Namely, new starting sites of growth are formed during formation of a coating. A thinner columnar structure is expected to provide an additional effect, that is, a crack becomes difficult to propagate in a direction parallel to the coating, i.e., a direction perpendicular to the columnar direction. The present inventors repeated various experiments to thin and shorten the columnar structure. As a result, it was discovered that this can be achieved by including an appropriate amount of carbon in the coating. Carbon substitutes for nitrogen of chromium nitride and is incorporated into the chromium nitride. Upon incorporation of carbon, the incorporation site seems to provide a new starting origin of columnar crystal growth.

Conditions for forming the columnar structure are not at all different from those described in Paragraph 0010 of Patent Document No. 4, i.e., Japanese Published Patent Application No. Hei 6-248425. However, the following facts were found. When the carbon concentration in a coating is 4% by weight or less, its effect of refining the columnar structure is not satisfactory, and a fracture toughness value, which reflects difficulty in crack propagation in a direction parallel to the coating surface is disadvantageously less than 3 MPa×$(m)^{1/2}$. In addition, the fracture toughness value was decreased to 3 or less at 8% by weight or more of C, presumably because a minute mount of chromium carbide had been formed.

(2) Crystal Structure

Preferably, the chromium nitride ion-plating coating according to the present invention has a main crystal structure of CrN-type chromium nitride. There are CrN-type chromium nitride and $Cr_2N$-type chromium nitride in the chromium nitride. Depending on the nitrogen concentration, there are a coating whose main structure is CrN-type chromium nitride, a coating whose main structure is $Cr_2N$-type chromium nitride, and a coating in which these chromium carbides are mixed. The same situation applies even when carbon is contained. However, the $Cr_2N$-type chromium nitride structure tends to have a fracture toughness value lower than that of the CrN-type chromium nitride structure. Therefore, the chromium nitride ion-plating coating preferably has a main structure of CrN-type chromium nitride.

(3) Texture

In addition, the chromium nitride ion-plating coating according to the present invention must have such a texture that the CrN (111) plane orients parallel to the coating surface. As is described hereinabove, cracks are difficult to propagate in a direction parallel to the coating surface (hereinafter referred to as the parallel direction). However, this effect is not quite satisfactory and a fracture toughness value of 3 MPa×$(m)^{1/2}$ or more cannot be attained. Therefore, various experiments were repeated. It was thus discovered that fracture toughness value can be outstandingly enhanced by forming a CrN (111) texture in the coating. The reason why the enhanced fracture resistance was obtained is not elucidated, but probably among other factors facture resistance of the columnar structure is increased. Texture degree must be from 0.4 to 0.9 in terms of structural coefficient. When the CrN (111) structural coefficient falls outside this range, the fracture toughness value is 3 MPa×$(m)^{1/2}$ or less.

(4) Hardness

Coating hardness of the chromium nitride ion-plating coating according to the present invention is Hv 1600-2000 in Vickers hardness. When the hardness is less than Hv 1600, wear resistance is not satisfactory as is described hereinabove. Since the coating hardness is determined by amount of pores in the coating, such hardness is attained by making the pore amount virtually zero.

(5) Conditions for Forming a Coating

Usually, as is disclosed in Patent Documents Nos. 5-7, when a nitride, carbide, or carbonitride ion-plating coating is formed by arc ion-plating, the metallic elements of vaporizing material can be vaporized by arc discharge in a low-pressure gas of nitrogen gas, hydrocarbon gas, or mixture of these gases. However, by conventional methods, it is impossible to obtain a specified chromium nitride ion-plating coating of the present invention; i.e., a coating whose structural coefficient of CrN (111) plane is 0.4 or more, or in other words, a coating having a so-called preferential texture of CrN (111), probably because decomposition and ionization of hydrocarbon gas is unsatisfactory. Argon gas should be added in an ion-plating apparatus so as to supplement the decomposition and ionization. Argon gas is liable to be more ionized as compared with a hydrocarbon gas. Free electrons, which have been increased due to ionized argon gas, seem to contribute to ionization of hydrocarbon gas. In order to demonstrate the argon's effect to the highest extent, the method discussed above is preferably carried out. According to this method, an ion-plating of Cr and an ion-plating of C and N are carried out in separate processes, and a mixed gas atmosphere of argon gas and hydrocarbon gas is established in a subsequent process.

A preferable ion-plating apparatus is an arc ion-plating apparatus, in which the vaporizing metallic elements are ionized at high ratio. This reason is the same as described above.

An arc ion-plating method of the present application is characterized in that a chromium nitride ion-plating coating is formed by the arc ion-plating method in a low-pressure gas atmosphere consisting of nitrogen gas, hydrocarbon gas, and argon gas, and at a bias voltage of −30V to 0V. When the bias voltage is lower than −30V, the diameter of columnar crystals is so large that the fracture toughness value of a coating is 3 MPa×(m)$^{1/2}$ or less and an object of the invention cannot be attained, probably due to the effect of ion impact.

Effects Of Invention

As is described hereinabove, the chromium nitride ion-plating coating according to the present invention has a fracture toughness value of 3 MPa×(m)$^{1/2}$ or more, and hence is well resistant against defective peeling off. In addition, since the coating hardness is Hv 1600 or more, wear resistance of a coating is improved. A piston ring having this coating on at least the outer peripheral surface thereof has improved wear resistance and scuffing resistance, and exhibits no defective peeling off. Abnormal wear of such piston ring does not occur and the piston ring has improved durability. Hereafter, the present invention will be described with reference to the examples. However, the present invention is not limited by such examples.

BEST MODE FOR CARRYING OUT THE INVENTION

Figure 1:
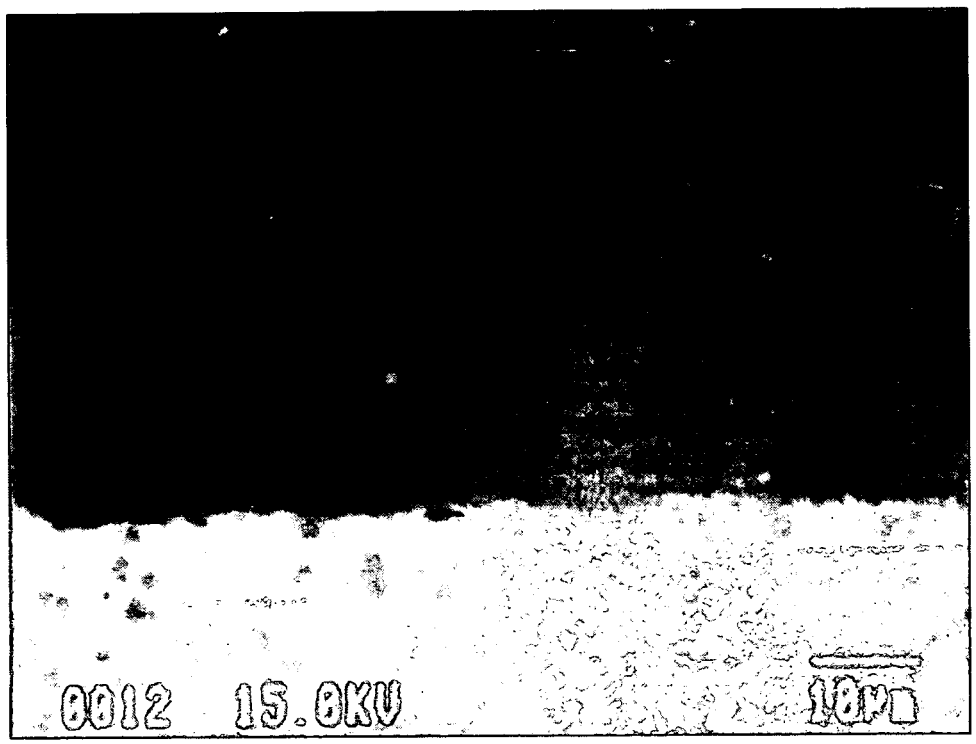
FIG. 1 A photograph showing a vertical cross section of a piston ring made of steel and having an ion-plating coating of the present invention.
Figure 2:
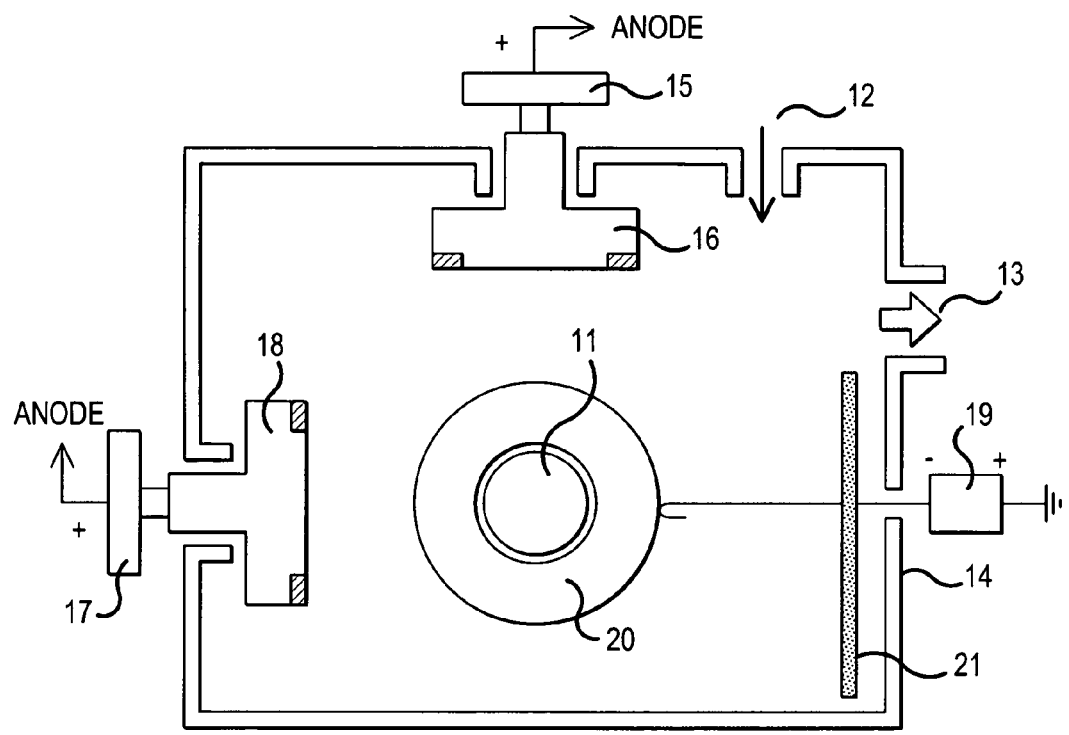
FIG. 2 A schematic drawing of an arc-ion-plating apparatus used in the Examples of the present invention.
Figure 3:
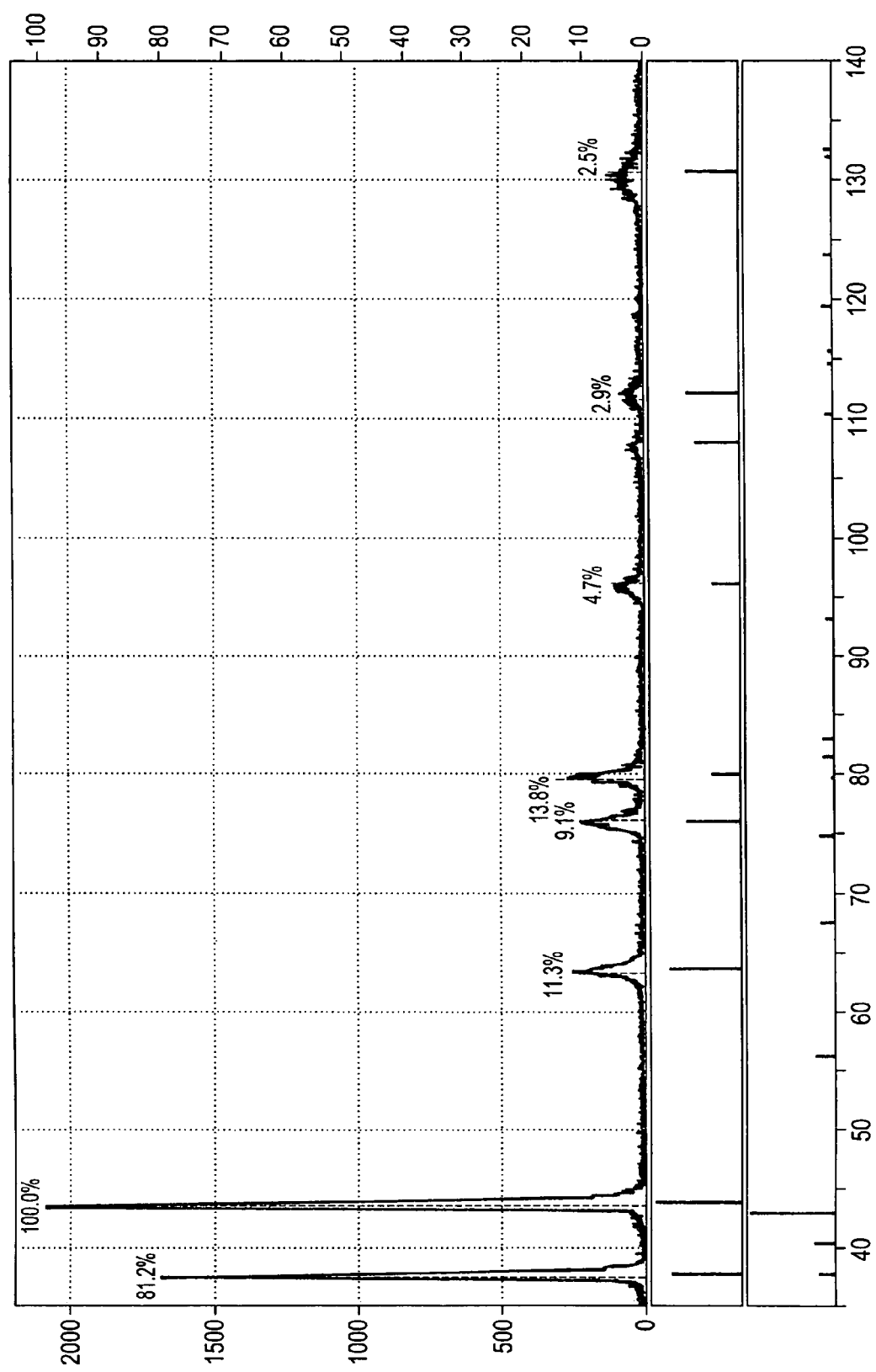
FIG. 3 An example of the diffraction pattern of a coating subjected to X-ray diffraction.
Figure 4:
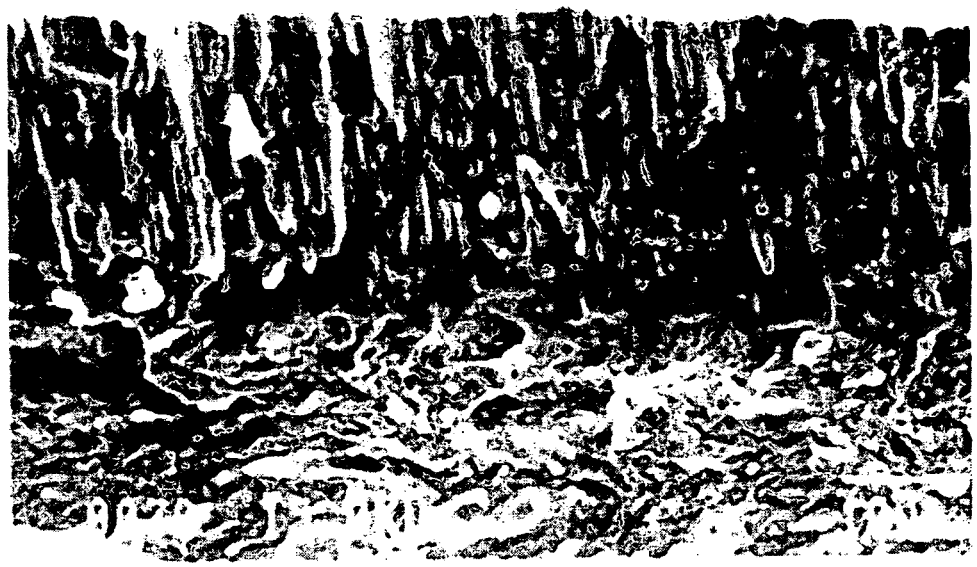
FIG. 4 An electron microscopic photograph of a cross section of a coating.

An arc ion-plating apparatus, schematically shown in FIG. 2, was used for forming a chromium nitride ion-plating coating according to the present invention. The structure of the apparatus and a method for forming a coating will next be described.

(Arc Ion-plating Apparatus)

The apparatus is provided with a vacuum chamber 14 having a gas inlet 12 and an exhausting outlet 13. A first target 16 connected to an anode of an arc power source 15 and a second target 18 connected to an anode of an arc power source 17 are located in the vacuum chamber 14. Metallic chromium is set on the first target 16 and the second target 18. The first target 16 and the second target 18 are arranged such that their positions from the treated surface are equi-distant. A rotary table 20 is located in the vacuum chamber 14 at its center and is connected to a bias power source 19. A work piece 11 is situated on the rotary table 20.

(Forming Method of Coating)

A method for forming a coating by arc ion-plating is described now in detail.

The first target 16, the second target 18, and the work piece 11 are placed as described above. Subsequently, the interior pressure of the vacuum chamber 14 is reduced to 0.033 Pa or less by withdrawing gas through the exhausting outlet 13. A heater 21 promotes emission of gases adsorbed on the inner wall of vacuum chamber and on the work piece, to thereby carry out degassing by heating. When the heating temperature is low, degassing is not satisfactory. When the heating temperature is high, creep deformation of the work piece 11 occurs. After completion of preheating, the rotary table 20 is rotated and argon gas is introduced through 12.

A negative bias voltage of −800 to −1000V is applied to generate arc discharge between the cathode (rotary table) and the anodes. Bombard cleaning is thus carried out. When the negative bias voltage is higher than −800V, satisfactory bombard cleaning effects are not attained. On the other hand, when the negative bias voltage is less than −1000V, the work piece may undergo temperature elevation and hence may be softened. Therefore, an optimum bias voltage and time should be determined by preliminary experiments. Reactive gas and argon gas are then introduced through the gas inlet 12. While the gas is introduced, the total pressure is controlled and a bias voltage of 0 to −30V is applied, whereby an ion-plating coating is formed.

EXAMPLES

Example 1

Examples of the present invention will next be described in detail.

The chromium nitride ion-plating coating of the present invention was evaluated as follows. A 17Cr stainless steel wire for a piston ring had a rectangular cross sectional shape of 2.5×4.3 mm in size. The wire was bent in the form of a ☐135 mm piston ring and was subjected to stress relief annealing. An end gap of the piston ring is formed. Polishing of the side and outer peripheral surfaces were carried out, thereby obtaining a piston-ring material. Approximately ten pieces of the piston ring material were vertically stacked in the form of a cylinder. The stacked pieces were subjected to detergent treatment by ultrasonic cleaning. The thus-treated stacked pieces were placed on the center of a rotary turn table of an arc ion-plating apparatus (AIP-3012, product of Kobe Seikosho Corporation). The first and second targets were made of metallic chromium. The pressure of the vacuum chamber was reduced to 0.033 Pa or less. While the rotary table was rotated, the temperature of a piston ring was elevated to 500 degrees C. with a heater.

After the temperature of the piston rings had arrived at 500 degrees C., a bias voltage of approximately −750V was applied to the piston rings. Arc discharge was generated between the metallic chromium cathode of the second target and the anode body. This body was subjected to bombarding by metallic chromium, at a 100 A arc current for 5 minutes.

Subsequently, while Ar gas was introduced for the purpose of forming a metallic Cr layer, a treatment was carried out at a pressure of 1.2 Pa, a bias voltage of −100V, and a current value of the first target of 200 A. The treatment was carried out for 20 minutes. Nitrogen gas was then introduced to form a stress-mitigating layer consisting of carbon-undissolved chromium nitride. While nitrogen was introduced, the pressure was set at 1.7 Pa, the bias voltage was set at −0V, and the arc current value was set at 200 A. Under these conditions, treatment was carried out for 60 minutes. Subsequently, methane gas was introduced so as to dissolve carbon in the nitride as a solute C. Partial pressure of the methane gas was changed to 0.2 Pa. This pressure was obtained through preliminary coating and corresponds to a pressure at which the carbon concentration in the laminated coating amounts to approximately 5 wt %. When the partial pressure of 0.2 Pa was attained, nitrogen gas and argon gas were introduced in controlled amounts to thereby attain a total pressure of approximately 1.7 Pa. Coating formation was carried out for 9 hours at a bias voltage of 0V and at an arc current value of 150 A. A chromium nitride coating having a thickness of approximately 50 μm was formed.

Examples 2-8 and Prior Art 1-3

Chromium nitride ion-plating coatings were formed by the same method as in Example 1 and under the conditions given in Table 2.

4) Measurement of Fracture Toughness Value

A Vickers probe was forced into the cross section of each specimen which was used for measuring the coating thickness as described hereinabove. The probe was pressed into the surface at the center of cross section, thereby forming an indentation and crack. Length of the indentation and crack was measured. A fracture toughness value was obtained from forcing load, width across corners of indentation, and length of crack. In the test, the testing load was 200 gf, and the time during which the load is applied was 15 sec. The elastic ratio used for calculating the fracture toughness value was 240263 MPa.

5) CrN(111) Texture and Structural Coefficient

An X-ray diffraction apparatus RINT 2100 manufactured by Rigaku was used to measure the X-ray diffraction pattern of a coating. A structural coefficient was quantitatively obtained from the measurement of the X-ray diffraction pattern so as to evaluate the CrN(111) texture. A top ring was cut into a piece having a length of approximately 15 mm from the gap end. Three pieces of approximately 15-mm long were obtained and were lightly degreased with acetone. The three pieces were arranged parallel on an XRD fixing jig and were subjected to XRD measurement. The measuring conditions were as hollows: Kα1 ray of copper as an X-ray source; scanning range−2θ=35−70 degree; applied voltage−40 kV ; applied current−30 mA; scanning step −0.02 degree; scanning speed−2 degree/min; divergence slit; and receptor slit− 0.3 mm. The structural coefficient was obtained using the X-ray diffraction pattern by the following definition shown by equation (1).

$$3 \times [I(111)/I_0(111)]/\Sigma[I(hkl)/I_0(hkl)] \quad (1)$$

TABLE 2

| | Total Pressure Pa | Partial Pressure of Nitrogen Pa | Partial Pressure of Ar Pa | Partial Pressure of Methane Pa | Bias Voltage V | Temperature of Underlying Layer Degrees C. | Arc Current A | Coating Time Hr |
|---|---|---|---|---|---|---|---|---|
| Example 1 | 1.7 | 1.31 | 0.26 | 0.13 | 0 | 500 | 150 | 9 |
| Example 2 | 1.7 | 1.21 | 0.25 | 0.24 | 0 | 500 | 150 | 9 |
| Example 3 | 1.7 | 1.33 | 0.11 | 0.27 | 0 | 500 | 150 | 9 |
| Example 4 | 1.7 | 1.08 | 0.22 | 0.4 | 0 | 500 | 150 | 9 |
| Example 5 | 1.7 | 1.01 | 0.2 | 0.49 | 0 | 500 | 150 | 9 |
| Example 6 | 1.7 | 1.21 | 0.25 | 0.24 | −15 | 500 | 150 | 9 |
| Example 7 | 1.7 | 1.21 | 0.25 | 0.24 | −30 | 500 | 150 | 9 |
| Example 8 | 1.7 | 1.21 | 0.25 | 0.24 | −40 | 500 | 150 | 9 |
| Prior Art 1 | 1.7 | 1.48 | 0.22 | 0 | 0 | 500 | 150 | 9 |
| Prior Art 2 | 1.7 | 1.45 | 0 | 0.25 | 0 | 500 | 150 | 9 |
| Prior Art 3 | 3.5 | 3.5 | 0 | 0 | −10 | 500 | 150 | 9 |

Investigation of Coating
1) Measurement of Coating Thickness

A cross section of each coating was embedded in a resin and mirror finished. Measurement under a metal microscope (magnification: 400 times) was carried out. The unit in the Table 3 is μm.

2) Measurement of Coating Hardness

Hardness of the mirror-finished coating surface was measured on its top surface using a micro Vickers hardness tester manufactured by Akashi Corporation at a load of 300 gf for 15 seconds. The unit of hardness is Hv.

3) Measurement of Carbon Concentration

A cross section of each coating was subjected to a quantitative analysis with an electron micro-analyzer, EPMA (JEOL JXA-8600S) manufactured by Nihon Denshi Corporation at an acceleration voltage of 15 kV and a probe current of $5 \times 10^8$ A. The obtained carbon concentration is expressed by W %

Here, I(hkl) is an X-ray diffraction intensity of a (hkl) peak. $I_0(111)=80$, $I_0(200)=100$, $I_0(220)=80$ are described in the JCPDS file as the standard X-ray diffraction intensity and were used for $I_0(hkl)$. Investigation results of these coatings are given in Table 3.

TABLE 3

| | Coating Thickness | Hardness (Hv) | Carbon Concentration (wt %) | Structural Coefficient | Diameter of Columnar Crystals μm | Fracture Toughness Value |
|---|---|---|---|---|---|---|
| Example 1 | 49.5 | 1620 | 4.1 | 0.8 | 0.2-0.5 | 3.3 |
| Example 2 | 50.2 | 1750 | 5.9 | 0.8 | 0.2-0.5 | 6 |
| Example 3 | 50.3 | 1860 | 6.5 | 0.4 | 0.2-0.5 | 3.1 |
| Example 4 | 51.4 | 1895 | 7.8 | 0.7 | 0.2-0.5 | 3.4 |
| Example 5 | 50.4 | 2046 | 9.7 | 0.6 | 0.2-0.5 | 2.3 |
| Example 6 | 51.2 | 1850 | 6.2 | 0.7 | 0.2-0.5 | 4 |

TABLE 3-continued

|  | Coating Thickness | Hardness (Hv) | Carbon Concentration (wt %) | Structural Coefficient | Diameter of Columnar Crystals μm | Fracture Toughness Value |
|---|---|---|---|---|---|---|
| Example 7 | 49.6 | 1950 | 6 | 0.8 | 0.3-0.6 | 3.2 |
| Example 8 | 50.9 | 2010 | 6.1 | 0.9 | 0.4-0.8 | 2.5 |
| Prior Art 1 | 49.5 | 1448 | 0 | 0.5 | 0.3-0.7 | 1.5 |
| Prior Art 2 | 49.7 | 1795 | 6.1 | 0.2 | 0.2 | 2 |
| Prior Art 3 | 50.2 | 1080 | 0 | (200) Texture | 5-8 | 3.2 |

The following can be said based on the results of the various measurements given in Table 2.

(a) Carbon Concentration

The carbon concentration of coatings is affected by the methane partial pressure during the formation of a coating. In Examples 1-8, in which the methane pressure is 0.19 Pa or more, the carbon concentration is 4.1 wt % or more, and the coating hardness is more than the target value Hv 1600. In prior Art 1 without the methane gas addition, the carbon concentration in the coating is naturally 0 wt %, and the coating hardness is as low as Hv1488, failing to arrive at the target value Hv 1600. Therefore, good wear resistance cannot be obtained. In addition, since carbon does not exert effects to refine the diameter of columnar crystals, the fracture toughness value is as low as 1.5, failing to arrive at the target value of 3.0. In Example 5, since the carbon concentration is 9.7 wt % and high, the coating hardness is Hv 2046. This high hardness is probably because of formation of chromium carbide. However, the fracture toughness value is 2.3, which is so low that defective peeling off may possibly occur in actual engines. The carbon concentration is therefore set at from 4 to 8 wt %.

(b) Crystal Texture and Structural Coefficient of Crystallographic Plane

Metallic chromium coating and thus chromium nitride coating are formed through ion-plating. The crystal texture of a CrN coating is largely affected by the total gas pressure, the argon gas partial pressure, and the bias voltage in the ion-plating stage. It turns out from Prior Art 3 that the crystal texture is CrN (200) plane at high nitrogen gas pressure during coating. Relatively low hardness (Hv 1080) of a coating does not cause an increase in the fracture toughness value. The argon gas added is ionized and exerts an effect to change the crystal texture of CrN coating to the (111) orientation and hence to increase the structural coefficient of the CrN(111) plane and fracture toughness value. Such coefficient is an index of the (111) plane texture. Example 8 shows that the structural coefficient of CrN (111) plane exceeds 0.9 and the fracture toughness value lowers at a higher bias voltage. Therefore, the structural coefficient of CrN (111) plane should be from 0.4 to 0.8, to ensure a fracture toughness value of 3 or more.

In order to evaluate the wear resistance and cracking resistance of the inventive coatings, an engine test of a piston ring, which is a main application example of the inventive coating, is carried out. Examples 1 through 5 and 8 in Table 3 were subjected to the engine test. The engine test was carried out for a diesel engine with six cylinders of 135 mm in inner diameter over 100 hours at a load of 4/4.

TABLE 4

| Cylinder No. | Tested Material | Defective Peeling Off | Wear Amount (μm) |
|---|---|---|---|
| #1 | Example 1 | No occurrence | 3.5 |
| #2 | Example 2 | No occurrence | 3.2 |
| #3 | Example 3 | No occurrence | 4.1 |
| #4 | Example 4 | No occurrence | 3.8 |
| #5 | Example 5 | Minute Cracks | 3.1 |
| #6 | Example 8 | No occurrence | 2.9 |

Table 4 reveals the following.
1. Cracks did not occur in the inventive products having a fracture toughness value of 3 or more.
2. Minute cracks are generated only in Example 5 which has a fracture toughness value of 2.3 and a hardness of Hv 2046.
3. There was no difference in wear amount attributable to the difference in hardness, probably because the lowest hardness in Example 1 was as high as Hv1620.

Industrial Applicability

The chromium nitride ion-plating is hard but is liable to crack. This property is overcome by the present invention in that a piston ring coating provided by the present invention has improved wear and scuffing resistances and improved crack resistance. Particularly, the coating can be used in diesel engines, where required levels of wear and scuffing resistances are increasingly severe.

The invention claimed is:

1. A chromium nitride ion-plating coating wherein the fracture surface of the coating has columnar crystals extending toward the surface of the coating, characterized in that the coating comprises chromium, nitrogen, and carbon; the concentration of carbon relative to the total concentration of the chromium, nitrogen, and carbon is from 4 to 8% by weight; the crystal structure of the coating is mainly formed of CrN-type chromium nitride; the texture of the CrN (111) plane orientation is from 0.4 to 2.0 in terms of a CrN (111) structural coefficient; and further a Vickers hardness is from Hv 1600 to Hv 2000.

2. A piston ring of an internal combustion engine, characterized in that the chromium nitride coating according to claim 1 is formed on at least an outer peripheral surface of the piston ring.

3. A method for forming a chromium nitride ion-plating coating according to claim 1, wherein a metallic chromium coating is formed by an arc ion-plating, and, subsequently, a chromium nitride ion-plating coating is formed by an ion-plating method in a low-pressure gas atmosphere consisting of nitrogen gas, hydrocarbon gas, and argon gas at a bias voltage of −30V to 0V.

* * * * *